US005481207A

United States Patent [19]

Crafts

[11] Patent Number: 5,481,207
[45] Date of Patent: Jan. 2, 1996

[54] HIGH SPEED, LOW POWER INPUT/OUTPUT CIRCUIT FOR A MULTI-CHIP MODULE

[75] Inventor: Harold S. Crafts, Colorado Springs, Colo.

[73] Assignees: AT&T Global Information Solutions Company, Dayton, Ohio; Hyundai Electronics America, Milpitas, Calif.

[21] Appl. No.: 427,916

[22] Filed: Apr. 19, 1995

Related U.S. Application Data

[63] Continuation of Ser. No. 997,472, Mar. 18, 1993, abandoned.

[51] Int. Cl.⁶ .................................................. H03K 17/16
[52] U.S. Cl. .................................. 326/86; 326/34; 326/30
[58] Field of Search ........................... 307/443, 451, 307/475, 526–527; 326/34, 86, 30

[56] References Cited

U.S. PATENT DOCUMENTS

| | | | |
|---|---|---|---|
| 4,029,971 | 6/1977 | Pryor | 307/209 |
| 4,217,502 | 8/1980 | Suzuki et al. | 307/205 |
| 4,329,600 | 5/1982 | Stewart | 307/540 |
| 4,488,067 | 12/1984 | Kraft et al. | 307/473 |
| 4,514,595 | 4/1985 | Rosenbaum et al. | 179/16 F |
| 4,531,068 | 7/1985 | Kraft et al. | 307/473 |
| 4,638,187 | 1/1987 | Boler et al. | 307/451 |
| 4,703,198 | 10/1987 | Porter | 326/86 |
| 4,764,956 | 8/1988 | Rosch et al. | 379/413 |
| 4,766,334 | 8/1988 | Warner | 307/540 |
| 4,782,250 | 11/1988 | Adams et al. | 307/473 |
| 4,855,623 | 8/1989 | Flaherty | 307/475 |
| 4,864,165 | 9/1989 | Hoberman et al. | 307/467 |
| 4,874,967 | 10/1989 | Deane | 307/296.8 |
| 4,877,978 | 10/1989 | Platt | 307/473 |
| 4,947,063 | 8/1990 | O'Shaughnessy et al. | 307/572 |
| 4,983,862 | 1/1991 | Suzuki | 307/475 |
| 5,004,936 | 4/1991 | Andresen | 307/443 |
| 5,019,728 | 5/1991 | Sanwo | 307/475 |
| 5,023,488 | 6/1991 | Gunning | 307/475 |
| 5,095,231 | 3/1992 | Sartori | 307/451 |
| 5,111,081 | 5/1992 | Atallah | 307/475 |
| 5,175,512 | 12/1992 | Self | 307/475 |
| 5,230,013 | 7/1993 | Hanke | 307/475 |
| 5,260,612 | 11/1993 | Lehmann | 307/475 |
| 5,270,589 | 12/1993 | Sawada et al. | 307/475 |
| 5,347,177 | 9/1994 | Lipp | 326/86 |
| 5,374,861 | 12/1994 | Kubista | 326/30 |
| 5,422,580 | 6/1995 | Mandel | 326/30 |

FOREIGN PATENT DOCUMENTS

| | | | |
|---|---|---|---|
| 0228585 | 2/1986 | European Pat. Off. | H03K 19/092 |
| 0235791 | 9/1987 | European Pat. Off. | |
| 1519672 | 8/1978 | United Kingdom . | |
| 8906068 | 6/1989 | WIPO | H03K 3/01 |

OTHER PUBLICATIONS

"Low Power Tri–State Driver Circuit," by W. R. Griffin and P. N. Horowitz, IBM Technical Disclosure Bulletin, vol. 24, No. 5, Oct. 1981, pp. 2556–2557.

"High Speed Complementary Driver Circuit," by W. R. Griffin and P. N. Horowitz, IBM Technical Disclosure Bulletin, vol. 24, No. 5, Oct. 1981, pp. 2558–2559.

Primary Examiner—Edward P. Westin
Assistant Examiner—Andrew Sanders
Attorney, Agent, or Firm—Wayne P. Bailey; Jack R. Penrod

[57] ABSTRACT

An I/O transceiver circuit for use on each integrated circuit of a multi-chip module that controls the threshold voltage of the receiver portion and also controls the output resistance of the transmitter portion. Control of the threshold voltage allows operation of the circuit at low voltage levels and with relative immunity from process and temperature variations. Control of the output resistance allows operation without characteristically terminated I/O lines between multi-chip modules, thereby saving power otherwise wasted in the terminating resistors. Control of the threshold voltage is achieved by means of a reference circuit. Control of the output resistance is achieved by a phase-locked-loop arrangement. Further, the I/O transceiver circuit may also have a state where it clamps noise pulses on its I/O line.

23 Claims, 6 Drawing Sheets

HIGH SPEED, LOW POWER INPUT/OUTPUT CIRCUIT FOR A MULTI-CHIP MODULE

This is a continuation of application Ser. No. 07/997,472 filed Mar. 18, 1993, now abandoned.

BACKGROUND OF THE INVENTION

The present invention relates to integrated circuits and more particularly to high speed, low power input/output circuits for use in equipment where high speed and low power are important, such as multi-chip modules.

As conventional integrated circuits become denser, i.e. more active devices per square centimeter, and faster, the required heat dissipation per square centimeter becomes greater and greater. This would be less of a problem if it meant that integrated circuits would be spaced further apart in order to dissipate this heat, but the direction of current integrated circuit technology is to space the integrated circuit chips closer and closer together. By spacing the integrated circuit chips as closely as possible, capacitive and inductive loading of output lead lines and the problems of driving output lead lines are reduced. Previous designs accepted the high heat densities of conventional integrated circuit logic connected in multi-chip modules and expended large amounts of energy and special purpose equipment, such as large heat sinks and liquid or cryogenic cooling, to cool the multi-chip modules.

Expending substantial amounts of money on cooling multi-chip modules could be eliminated and energy saved if the logic on the multi-chip modules simply dissipated less heat to start with.

It is an object of the present invention to provide a digital integrated circuit that dissipates less heat.

It is another object of the present invention to provide an input/output circuit that consumes less power than conventional logic circuits without compromising data handling speed.

It is a further object of the present invention to provide a high speed, low power input/output circuit for use on an integrated circuit chip.

It is a further object of this invention to provide a tri-state input/output for connection to a high speed multi-chip module bus.

SUMMARY OF THE INVENTION

Briefly stated, in accordance with one aspect of the invention the foregoing objects are achieved by providing an integrated circuit that has a plurality of I/O transceiver circuits upon it. Each of the I/O transceiver circuits is connected to a common threshold voltage control circuit that controls a receiving threshold voltage characteristic of each transceiver circuit. Also connected to each of the I/O transceiver circuits is an output resistance control circuit that controls an output resistance of each I/O transceiver circuit to a constant value.

In accordance with another aspect of the invention, the foregoing objects are achieved by providing an input/output transceiver for an integrated circuit. The input/output transceiver includes a pad located on the integrated circuit substrate, a receiving circuit connected to the pad for receiving digital signals inputted thereon and a transmitting circuit connected to the pad for transmitting digital signals to the pad. An input voltage threshold of the receiving circuit is controlled and an output resistance of the transmitting circuit is controlled such that both the received digital signals and the transmitted digital signals are of the low current, low voltage differential type.

BRIEF DESCRIPTION OF THE DRAWINGS

While the specification concludes with the appended claims particularly pointing out and distinctly claiming the subject matter which is regarded as the invention, it is believed that the invention will be better understood from the following description taken in conjunction with the accompanying drawings in which:

DETAILED DESCRIPTION

Figure 1:
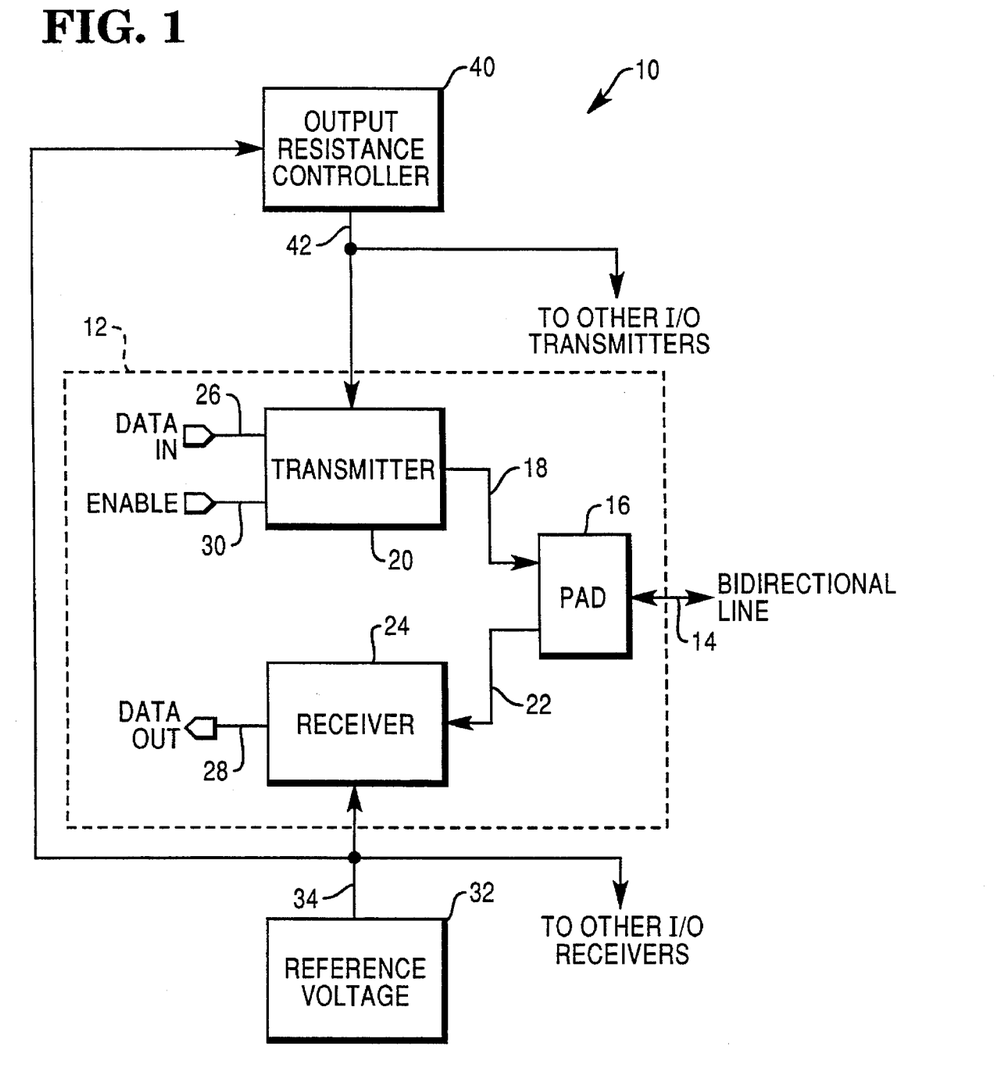
FIG. 1 is a partially broken away block diagram of an integrated circuit and an I/O transceiver circuit thereof according to the present invention.

Referring now to FIG. 1, a portion of an integrated circuit 10 is shown. Integrated circuit 10 has a number of substantially similar input/output (I/O) transceiver circuits of which a representative I/O transceiver circuit 12 is shown. For the sake of simplicity and brevity, only I/O transceiver circuit 12 will be described.

I/O transceiver circuit 12 is designed for use with high speed, low power integrated circuits such as are used in multi-chip modules. I/O transceiver circuit 12 is especially designed to transmit and receive digital data with a reduced voltage difference between a logic HIGH and a logic LOW than standard CMOS and TTL digital integrated circuits, yet maintain an acceptable noise margin of at least 400 millivolts. I/O circuit 12 is typically connected by a non-terminated bi-directional bus line 14 to a similar I/O circuit (not shown). Those skilled in the digital integrated circuit art will recognize that reduced voltage difference between logic levels and the non-terminated line provide for a reduced amount of power delivered by the I/O transceiver 12, a reduced amount of power dissipated by the I/O transceiver 12 and a higher data transfer speed. These attributes are all very desirable for multi-chip modules assemblies and sub-assemblies, although these attributes are also useful for other applications than multi-chip module assemblies.

The bi-directional line 14 connects to I/O transceiver 12 at an I/O pad 16 located on the integrated circuit 10 (through an integrated circuit lead that is not shown for simplicity). Within the I/O transceiver 12, I/O pad 16 connects to a transmitter 20 by line 18 and to a receiver 24 by line 22. Transmitter 20 receives data for transmission on data line 26 from internal logic (not shown) of the integrated circuit 10. Receiver 24 receives data signals from pad 16 through line 22, processes these data signals into data signals outputted on data output line 28 to internal logic (not shown) of the integrated circuit 10. The data mode of I/O transceiver 12 is determined by an ENABLE signal inputted to transmitter 20 on line 30.

I/O transceiver 12 operates on binary levels that are separated by a reduced voltage separation. Because of this reduced separation, which is an advantage of this invention, it is necessary to reduce variations in the receiving threshold voltage and the transmitting output resistance of the transceiver 12. Receiver 24 is connected to a reference voltage circuit 32 by line 34. Reference voltage circuit 32 accurately sets the threshold voltage of receiver 24 and of any other similar receiver (not shown) of the integrated circuit 10. Transmitter 20 is connected to an output resistance controller circuit 40 by line 42. Output resistance controller circuit 40 controls the output resistance of the transmitter 20 to a constant value of resistance. A transmitter with a small constant value of output resistance has been determined by simulations to be the best way from a noise aspect to drive the non-terminated bus line 14.

The use of reference voltage circuit 32 to control the input threshold switching level and output resistance controller circuit 40 to control the output driving resistance enables the use binary logic levels separated by only 1.0 volts with a noise margin of 0.4 volts.

Figure 2:
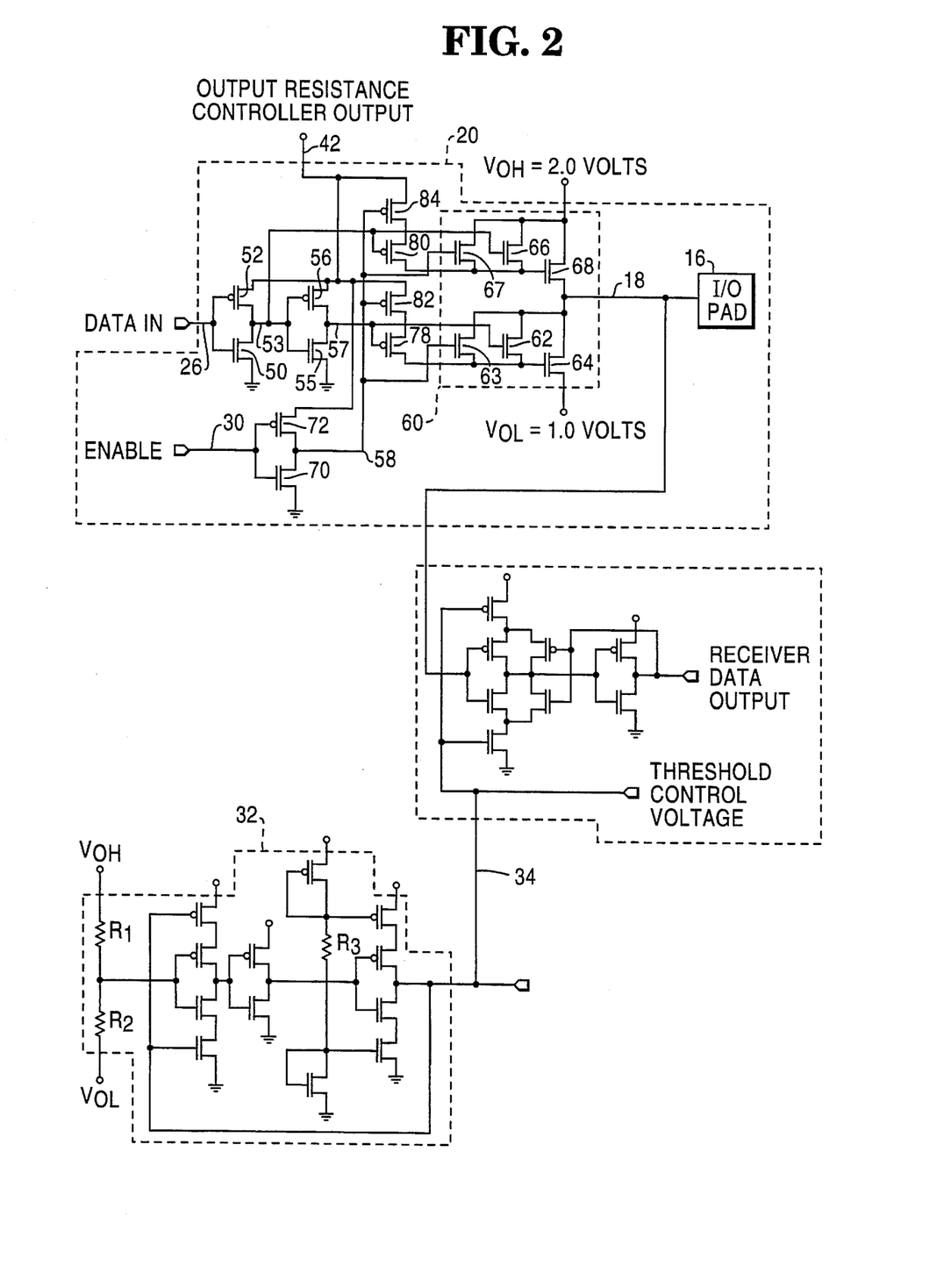
FIG. 2 is a schematic of the transmitter, the receiver, and the reference voltage supply portions of FIG. 1, according to one embodiment of the invention.

Referring now to FIG. 2, a specific embodiment of the invention shown in FIG. 1 will be described. Receiver 24 and reference voltage circuit 32 are described in U.S. patent application Ser. No. 986,184 identified as NCR Docket No. 5105, also by Harold S. Crafts, entitled THRESHOLD CONTROLLED INPUT CIRCUIT FOR AN INTEGRATED CIRCUIT. This other application is commonly assigned to NCR Corporation and is hereby incorporated by reference.

Transmitter 20 has an input for data signals to be transmitted connected to line 26. Data signals on line 26 are connected commonly to the gates of NFET 50 and PFET 52. NFET 50 has its source connected to circuit ground and its drain connected to the drain of PFET 52. The source of PFET 52 is connected to the output of output resistance control circuit 40 via line 42. FETs 50, 52 form a CMOS inverter, which inverts and amplifies the inputted data signals and conveys the inverted and amplified data signals by line 53 to the gates of NFET 55 and PFET 56. NFET 55 has its source connected to circuit ground and its drain connected to the drain of PFET 56. The source of PFET 56 is connected to the output of output resistance control circuit 40 via line 42. FETs 55, 56 form a second CMOS inverter which inverts and amplifies the inputted data signals a second time and conveys the twice amplified and inverted data signals along line 57 to one input of an output driver 60.

The inverted and amplified data signals from FETs 50, 52 are also conveyed by line 53 to a second input of output driver 60. Thus, output driver 60 has a first input that is the data signal twice inverted and a second input that is the same data signal once inverted. This means the data on the two inputs will always be inverted relative to each other.

Output driver 60 has a gate of NFET 62 and a gate of PFET 78, which together form the first input, connected to line 57. The drain of NFET 62 is connected to the pad 16 by line 18. The source of PFET 78 is connected through an enabling PFET 82 to the output resistance controller voltage on line 42. The source of NFET 62 and the drain of PFET 78 are connected to a gate of NFET 64. The drain of NFET 64, like the drain of NFET 62 is connected to pad 16. The source of NFET 64 is connected to VOL, which in the preferred embodiment is 1.0 volts. When the logic level on data input line 26 is a logic low, line 57 is also a logic low, PFET 78 is turned on and NFET 62 is turned off. For such a situation, the output resistance control voltage will be switched onto the gate of NFET 64, causing NFET 64 to conduct and pull the voltage of pad 16 to substantially VOL.

Output driver 60 also has a gate of NFET 66 and a gate of PFET 80, which together form the second input, connected to line 53. The drain of NFET 66 is connected to VOH, which in the preferred embodiment is 2.0 volts. The source of PFET 80 is connected through enabling PFET 84 to the output resistance controller voltage on line 42 The source of NFET 66 and the drain of PFET 80 are connected to the gate of NFET 68. The drain of NFET 68, like the drain of NFET 66, is connected to VOH. The source of NFET 68 is connected to pad 16 by line 18. When the data signal on line 26 is a logic high, the inverted signal on line 53 will be a logic low, NFET 66 will be turned off and PFET 67 will be turned on. For that situation, the output resistance control voltage will be switched onto the gate of NFET 68 and NFET 68 will conduct, pulling up the voltage level of pad 16 to substantially VOH.

For a logic high level data signal on line 26, (shown in FIG. 1) transmitter 20 outputs substantially VOH to pad 16. For a logic low level on line 26, transmitter 20 outputs substantially VOL to pad 16. With such characteristics, transmitter 20 is called a non-inverting transmitter.

The previous discussion assumed that the transmitter 20 is enabled, i.e. that the logic level on line 30 was a logic high. Line 30 conducts the enable signal to commonly connected gates of NFET 70 and PFET 72. NFET 70 has its source connected to circuit ground and its drain connected to the drain of PFET 72. The source of PFET 72 is connected to the output of output resistance control circuit 40 via line 42. FETs 70, 72 form a CMOS inverter, which inverts and amplifies the logic high input enable signal and conveys the amplified and inverted signal, at this point a logic low, by line 58 to PFET 82 and also by line 58 to PFET 84 and NFETs 67, 63. PFETs 82 and 84 are turned off by the logic high on line 58. PFETs 82 and 84 are placed in a conducting state by the logic low on line 58, and such conduction supplies NFETs 63, 67 with the high voltage level that is outputted from output resistance controller 40 on line 42.

When the transmitter 20 is disabled, i.e. when the logic level on line 30 is a logic low, FETs 70, 72 invert the logic low to a logic high on line 58. A logic high on the gates of PFETs 82, 84 will turn them off and remove the positive voltage supply from NFETs 63, 67. Further, the logic high on the gates of NFETs 63, 67 will turn them on, thereby shorting the drains of output NFETs 64, 68 to their respective gates and causing these output NFETs 64, 68 to act as clamping diodes.

Figure 3:
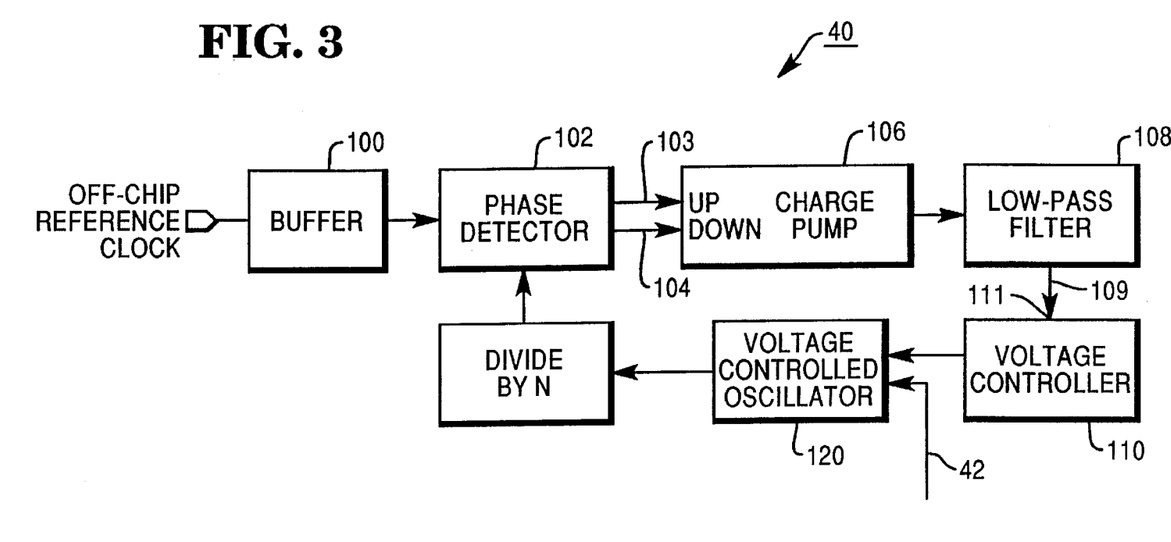
FIG. 3 is a block diagram of a phase locked loop that is used as the output resistance controller portion of FIG. 1, according to one embodiment of the invention.

Referring now to FIG. 3, the output resistance controller 40 will be described. The output resistance controller 40 is a phase locked loop with some special properties and characteristics, as will be explained below. The output resistance controller 40 is connected to an off-chip reference clock (not shown) as a accurate, stable source of digital pulse signals. The off-chip reference clock is received on an input of a buffer 100, to shape the input digital pulses and remove as much noise as possible therefrom. The buffer 100 has an output which is connected to a first input of a phase detector 102. Phase detector 102 has a second input which comes from a local VCO via a divide by N circuit, as will be explained below.

Figure 4:
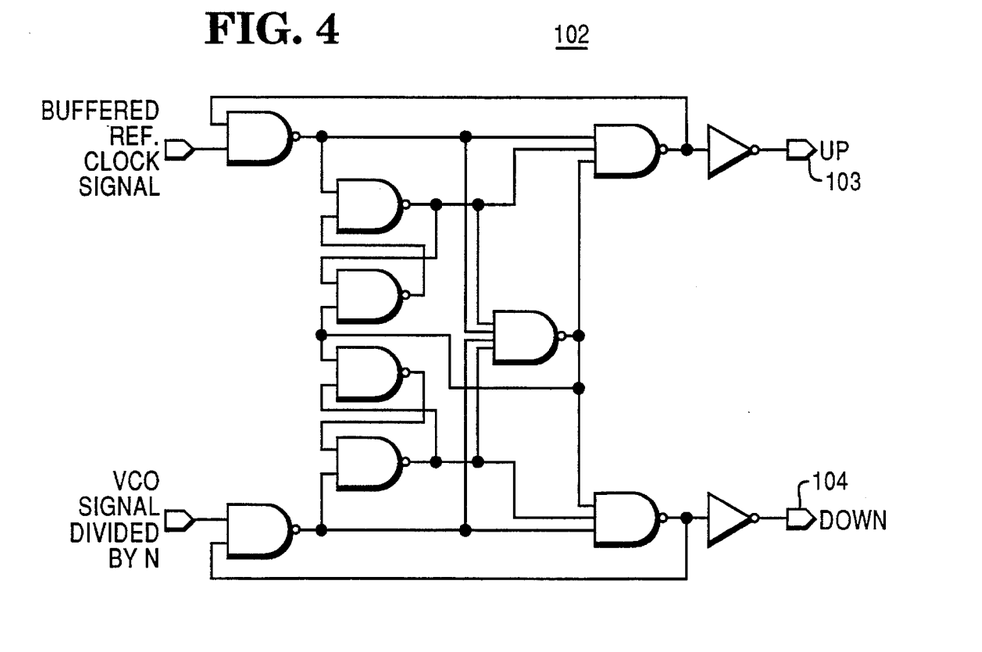
FIG. 4 is a logic diagram of the phase detector portion of the phase locked loop of FIG. 3.

Referring now to FIG. 4, a preferred embodiment of the phase detector 102 is shown. The circuit of FIG. 4 uses all NAND gates with two inverters, one on each of the outputs. This preferred embodiment is for a CMOS implementation. Those of average skill in the art will recognize that other types of phase detector could also be used for CMOS or other logic family implementations. This embodiment is preferred because it detects frequency as well as phase, and thus prevents harmonic locking as phase locked loops are known to be prone to.

Phase detector 102 has two outputs as well as two inputs. The first output 103 is true if the local VCO frequency must go up to match the reference clock input in frequency. The second output 104 is true if the local VCO frequency must go down to match the reference input frequency.

Figure 5:
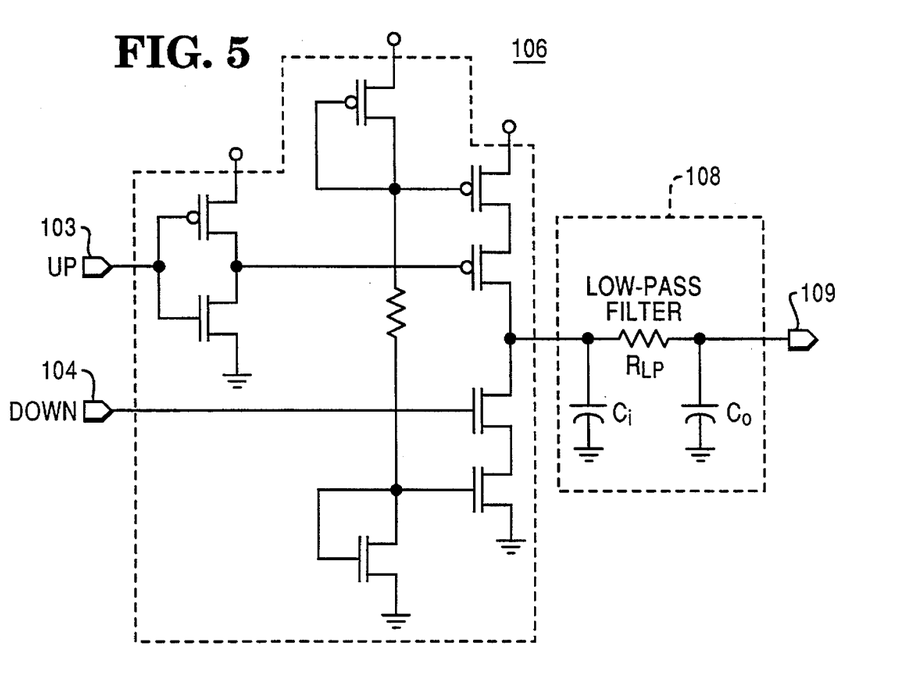
FIG. 5 is a schematic diagram of the charge pump portion and a low pass filter portion of the phase locked loop of FIG. 3.

Referring back to FIG. 3, the phase detector outputs 103 and 104 are connected to up and down inputs of a charge pump 106. The output signals on outputs 103 and 104 represent phase error signals, as is well known in the art of phase locked loops. The charge pump 106 is a type of amplifier that pumps electric charge into or out of a low pass filter 108 attached to its output as a function of the error signals on outputs 103 and 104. Referring briefly to FIG. 5, a preferred embodiment of the charge pump 106 and the low pass filter 108 are shown. The charge pump 106 receives the digital error signals from phase detector outputs 103, 104, processes and amplifies these error signals and outputs an error current to low pass filter 108. The low pass filter 108 averages the error current and integrates it into a relatively long term averaged control voltage at an output terminal 109 connected to an output capacitor Co.

Figure 8:
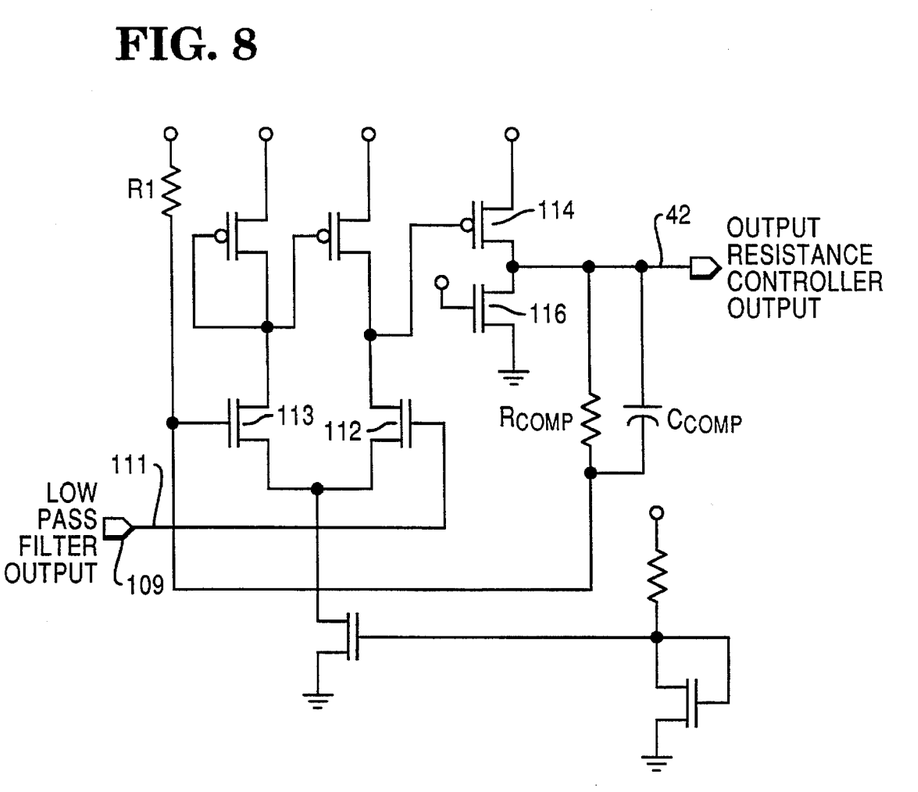
FIG. 8 is a schematic diagram of the voltage controller portion of the phase locked loop of FIG. 3.

Referring now to FIGS. 3 and 8, the output 109 of the low pass filter 108 is connected to an input 111 of a control voltage circuit 110. Control voltage stage 110 has a differential amplifier stage formed by FETs 112, 113. The input 111 is connected to the gate of FET 112. FET 113 has its gate connected to the output of the control voltage circuit 110 through a feedback compensation network formed by the parallel combination of $R_{comp}$ and $C_{comp}$. FETs 112 and 113 are a high speed type to increase the gain bandwidth product of the circuit 110 in order to allow high speed tracking of the error signal from the low pass filter 108. The output signal of the differential amplifier is taken from the drain of FET 112 and connected to the gate of output FET 114, which is connected in a common source configuration with its output load resistance being provided by FET 116. The control voltage circuit 110 takes the error voltage from low pass filter 108, which is a low power and high impedance circuit, and outputs the amplified error signal at a higher power level and at a lower impedance level. This is important because this amplified error signal is the output resistance control voltage that is supplied to the driver 20 via line 42. This amplified error signal is connected to VCO 120 (shown in FIGS. 3 and 6).

Figure 6:
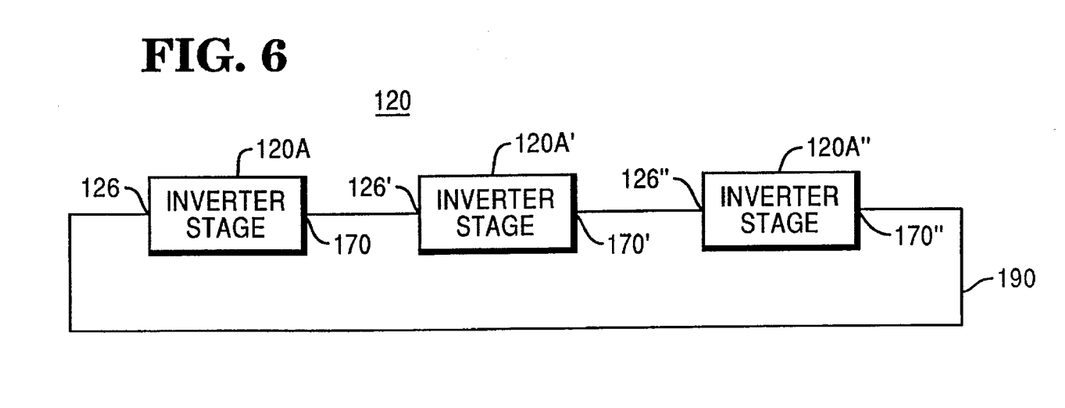
FIG. 6 is a block diagram of the voltage controlled oscillator portion of the phase locked loop of FIG. 3.

Referring now to FIGS. 3 and 6, the VCO 120 will be described. As shown in FIG. 6, VCO 120 is made up of three identical special inverter stages 120A, 120A', and 120A" connected in series. Each of these stages has a respective input 126, 126' and 126" and a respective output 170, 170' and 170". The output 170 is connected to the input 126'. The output 170' is connected to the input 126". The output 170" is connected back to the input 126, thereby forming a ring oscillator. Those skilled in the art will recognize that similar ring oscillators can be formed with any odd number of stages greater than three.

Figure 7:
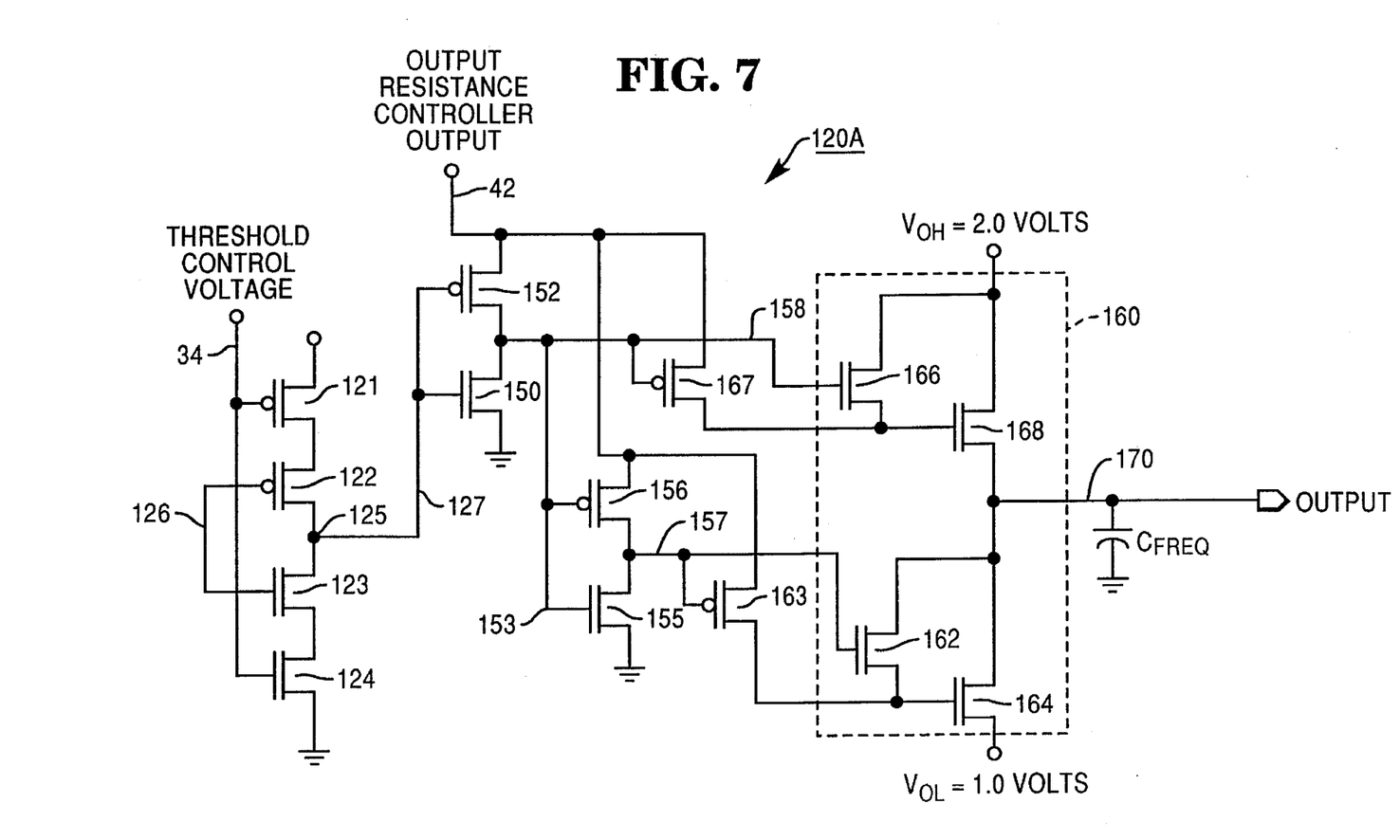
FIG. 7 is a schematic diagram of one stage of a multiple stage voltage controlled oscillator according to the invention.

Referring now to FIG. 7, each of the special inverter stages 120A, 120A' and 120A" will be described. Each of the special inverter stages 120A, 120A' and 120A" has FETs 121, 122, 123, and 124 that are connected in series as a four FET inverter stage. FETs 121 and 124 have their gates connected to each other and also to the threshold control voltage on line 34 (shown in FIG. 2). FETs 122 and 123 have their gates connected to each other and to line 126 which supplies negative feedback, as will be explained. Connected in this manner, PFET 122 and NFET 123 operate as a CMOS inverter whose threshold logic level is set by the threshold control voltage on line 34. The output of this inverter is taken from a junction 125 of the drain of PFET 122 with the drain of the NFET 123. The junction 125 is connected by line 127 to the gates of PFET 152 and NFET 150 which are connected in series in a CMOS inverter configuration, which will be explained in detail below.

PFET 152 has its source connected to line 42, which has the control voltage from voltage control 110 (see FIGS. 3 and 7) thereon. The drain of PFET 152 is connected to the drain of NFET 150. The source of NFET 150 is connected to circuit ground. The inverter formed by FETs 150, 152 inverts and amplifies any signal inputted on line 127. This inverted and amplified signal is conveyed by line 153 to the gates of NFET 155 and PFET 156. NFET 155 has its source connected to circuit ground and its drain connected to the drain of PFET 156. The source of PFET 156 is connected to the control voltage outputted by the voltage controller 110 via line 42. FETs 155, 156 form another CMOS inverter which inverts and amplifies the inputted signal further and conveys the thrice amplified and inverted data signals along line 157 to one input of a power driver 160.

The inverted and amplified signal from FETs 150, 152 are also conveyed by lines 153, 158 to a second input of power driver 160. Thus, power driver 160 has a first input that is the signal inputted on line 157 twice inverted and a second input on line 158 that is the same data signal once inverted. This means the data on these two inputs will always be inverted relative to each other.

Power driver 160 has a gate of NFET 162 and a gate of PFET 163, which together form the first input, connected to line 157. The drain of NFET 162 is connected to an output line 170. The source of PFET 163 is connected to the voltage controller 110 on line 42. The source of NFET 162 and the drain of PFET 163 are connected to a gate of NFET 164. The drain of NFET 164, like the drain of NFET 162 is connected to output line 170. The source of NFET 164 is connected to VOL, which in the preferred embodiment is 1.0 volts. Including the CMOS inverter formed by FETs 121–124, when the logic level on input line 126 is a logic high, line 157 is a logic low, PFET 163 is turned on and NFET 62 is turned off. For such a situation, the control voltage from the voltage controller 110 will be switched onto the gate of NFET 164, causing NFET 164 to conduct and pull the voltage of output line 170 towards VOL.

Power driver 160 also has a gate of NFET 166 and a gate of PFET 167, which together form the second input, connected to line 158. The drain of NFET 166 is connected to VOH, which in the preferred embodiment is 2.0 volts. The source of PFET 167 is connected to the control voltage from the voltage controller 110 on line 42 The source of NFET 166 and the drain of PFET 167 are connected to the gate of NFET 168. The drain of NFET 168, like the drain of NFET 166, is connected to VOH. The source of NFET 168 is connected to output line 170. Including the CMOS inverter formed by FETs 121–124, when the signal on line 126 is a logic low, the twice inverted signal on line 158 will be a logic low, NFET 166 will be turned off and PFET 167 will be turned on. For that situation, the control voltage from the voltage controller 110 will be switched onto the gate of NFET 168 causing NFET 168 to conduct and pull up the voltage level of output line 170 towards VOH.

As mentioned previously with respect to FIG. 6, the output 170" of special inverter stage 120A" is fedback to input 126 of special inverter stage 120A to form the VCO 120, which is a ring oscillator. The frequency of oscillation of this ring oscillator is determined by the propagation and delay characteristics of the individual stages of the ring. In addition to the characteristic delay associated with power driver 160, each stage also has a capacitor, $C_{freq}$, connected from its output to circuit ground. Connected in this manner, the characteristic series resistance of each power driver, which is essentially the series resistance of output NFETs 164 and 168, forms an RC timing network with its respective capacitor $C_{freq}$. By taking a nominal series output resistance for each stage and preselecting a capacitance of $C_{freq}$ for each stage to provide a frequency of oscillation that is nominally the same as the frequency of the off-chip reference clock, the free running frequency of the VCO 120 is determined. If the off-chip clock at a frequency that is lower than the natural frequency of the VCO 120, the VCO frequency may be run at N times the off-chip reference clock value and divided by N as shown in FIG. 3.

In operation, since $C_{freq}$ has a constant value and the off-chip clock has a constant frequency, the phase locked loop 40 (shown in FIG. 3) will control the power driver series resistance to be a constant value by means of the control voltage on line 42. Further, since the configuration of the power driver 160 is selected to be the substantially the same as the configuration of the output driver 60, by connecting the same control voltage on line 42 to equivalent connections of output driver 60, i.e. the drains of FETs 56, 63, and 67 (shown in FIG. 3), the output resistance of output driver 60, as well as any other output driver that is similarly connected, will be controlled to a constant value also.

Thus, it will now be understood that there has been disclosed a new and novel input/output circuit for multi-chip module applications which includes direct connection to unterminated output bus lines. Also, both the receiver and the transmitter are controlled to have sufficient noise margins in order to operate at reduced logic voltage levels to reduce power dissipation. While the invention has been particularly illustrated and described with reference to preferred embodiments thereof, it will be understood by those skilled in the art that various changes in form, details, and applications may be made therein. For example, the VOH and VOL could be varied from the preferred values of 2.0 volt and 1.0 volt and still reduce power dissipation. It is accordingly intended that the appended claims shall cover all such changes in form, details and applications which do not depart from the true spirit and scope of the invention.

What is claimed as new and desired to be secured by letters patent of the United States is:

1. An input/output transceiver circuit for an integrated circuit, comprising:
   a pad located on an integrated circuit substrate;
   a receiving circuit connected to said pad for receiving digital circuits inputted thereon; and
   a transmitting circuit connected to said pad for transmitting digital signals to said pad;
   said transmitting circuit during data transmission has an output resistance that is controlled to a constant value.

2. An input/output transceiver circuit for an integrated circuit according to claim 1, further comprising means for controlling said output resistance to a constant value connected to said transmitting circuit.

3. An input/output transceiver circuit for an integrated circuit according to claim 2, wherein said output resistance controlling means includes a phase locked loop.

4. An input/output transceiver circuit for an integrated circuit according to claim 3, wherein said phase locked loop has a voltage controlled oscillator.

5. An input/output transceiver circuit for an integrated circuit according to claim 4, wherein:
   said transmitting circuit has an output stage and the resistance of said transmitting circuit is substantially the resistance of said output stage;
   said voltage controlled oscillator has an output stage that is substantially the same as said transmitting circuit output stage and has an output resistance that is substantially the same as said transmitting circuit resistance;
   said voltage controlled oscillator output stage resistance controls a frequency of operation of said phase locked loop and said phase locked loop maintains said natural frequency by an error signal that is fed back to said voltage controlled oscillator to maintain the resistance thereof at a constant value; and
   said error signal is also connected to said transmitting circuit output stage to maintain the resistance thereof at a similar constant value.

6. An input/output transceiver circuit for an integrated circuit according to claim 1, further comprising means for clamping a signal received by said pad during non-data transmission operation.

7. An input/output transceiver circuit for an integrated circuit according to claim 1, wherein said receiving circuit includes:
   a series summing amplifier means having a first inverting input, a second inverting input and an output for providing a binary output voltage at said output that is a logic low if an input voltage on said first inverting input exceeds an input voltage on said second inverting input by a threshold voltage, otherwise said binary output is a logic high; and
   means for providing a reference voltage connected to said first inverting input.

8. An input/output transceiver circuit according to claim 7, further comprising;
   a second series summing amplifier means having a first inverting input, a second inverting input and an output for providing a binary output voltage at said output that is a logic low if an input voltage on said first inverting input exceeds an input voltage on said second inverting input by a threshold voltage, otherwise said binary output is a logic high;
   said means for providing a reference voltage is also connected to said second inverting input of said second series summing amplifier means.

9. An input/output circuit according to claim 7, further comprising:
   a second series summing amplifier means having a first inverting input, a second inverting input and an output for providing a binary output voltage at said output that is a logic low if an input voltage on said first inverting input exceeds an input voltage on said second inverting input by a threshold voltage, otherwise said binary output is a logic high;

said means for providing a reference voltage is connected to said first inverting input of said second series summing amplifier;

means for providing a binary complement of a logic level impressed upon an input thereof at an output thereof connected to said output of said first series summing amplifier means;

a SET-RESET flip-flop having its SET input connected to said output of said binary complement means and its RESET input connected to said output of said second series summing amplifier; and said first inverting input of said first series summing amplifier is connected to said second inverting input of said second series summing amplifier and to an input terminal;

wherein from said input terminal to an output of said SET-RESET flip-flop form a Schmitt trigger circuit.

10. An input/output circuit according to claim 7, further comprising:

a second series summing amplifier means having a first inverting input, a second inverting input and an output for providing a binary output voltage at said output that is a logic low if an input voltage on said first inverting input exceeds an input voltage on said second inverting input by a threshold voltage, otherwise said binary output is a logic high;

a second means for providing a reference voltage is connected to said first inverting input of said second series summing amplifier;

means for providing a binary complement of a logic level impress upon an input thereof at an output thereof connected to said output of said first series summing amplifier means;

a SET-RESET flip-flop having its SET input connected to said output of said binary complement means and its RESET input connected to said output of said second series summing amplifier; and said first inverting input of said first series summing amplifier is connected to said second inverting input of said second series summing amplifier and to an input terminal;

wherein from said input terminal to an output of said SET-RESET flip-flop form a Schmitt trigger circuit.

11. An input/output circuit according to claim 7, wherein:

said series summing amplifier means includes a first p-channel FET, connected in series with a second p-channel FET, connected in series with a first n-channel FET, connected in series with a first n-channel FET;

a gate of said first p-channel FET and a gate of said second n-channel FET are connected and together provide said second inverting input;

a gate of said second p-channel FET and a gate of said first n-channel FET are connected and together provide said first inverting input; and said output of said series summing amplifier means is located at the series connection point between said second p-channel FET and said first n-channel FET.

12. An input/output circuit according to claim 11, wherein:

said reference voltage providing means includes:

a series summing amplifier stage having a first inverting input, a second inverting input and an output;

said series summing amplifier stage is connected between VDD and circuit ground;

a first complementary series inverter stage having an input and an output;

said input is connected to said output of said series summing amplifier stage;

a second complementary series inverter stage having an input and an output;

said input of said second complementary series inverter stage is connected to said output of said first complementary series inverter stage;

said first inverting input is connected to a reference voltage; and said second inverting input is connected to said output of said second complementary series inverter;

wherein an output voltage at the output of said second complementary series inverter stage is caused by this reference voltage providing means to be substantially the level of the reference voltage.

13. An input/output circuit according to claim 12, wherein said reference voltage is provided by a voltage divider.

14. An input/output circuit according to claim 13 wherein said first complementary series inverter includes a p-channel FET connected in series with an n-channel FET.

15. A input/output circuit according to claim 14, wherein said second complementary series inverter includes a p-channel FET connected in series with an n-channel FET.

16. A logic transceiver circuit comprising:

a pad on an integrated circuit substrate;

means for transmitting binary signals having a nominal logic high level of 2.0 volts and a logic low level of 1.0 volts connected to said pad, said transmitting means transmits said binary signals to said pad; and means for receiving binary signals having a nominal logic high level of 1.6 volts and nominal logic low level of 1.4 volts also connected to said pad, said receiving means receives binary signals from said pad.

17. A logic transceiver circuit according to claim 16, wherein:

said logic transceiver circuit is an input/output circuit; and said input/output circuit dissipates less energy because of the small difference in the logic high level and the logic low level.

18. A logic transceiver according to claim 16, wherein:

said transmitting means has means for controlling an output resistance thereof.

19. A logic transceiver circuit according to claim 18, wherein said output resistance controlling means includes a phase locked loop.

20. A logic transceiver circuit according to claim 16, wherein said receiving means has a means for controlling an input threshold thereof.

21. A logic transceiver circuit, according to claim 20, wherein said input threshold controlling means includes a stable direct current voltage means.

22. A process for producing a binary integrated circuit with threshold control voltage on each data input/output transceiver circuit, comprising the steps of:

locating a reference voltage circuit that provides a reference voltage at an output thereof on an integrated circuit chip;

locating a plurality of data input circuits, each of which has a binary input that receives respective binary input voltages, a threshold control input and a binary output;

connecting said reference voltage output to each threshold control input to control a threshold voltage that defines the point at which a binary input voltage ceases to be defined as a logic zero and begins to be defined as a logic one;

locating an output resistance controlling circuit that provides a resistance controlling voltage at an output thereof on said integrated circuit chip;

locating a plurality of data output circuits, each of which has a binary output that transmits respective binary output voltages and a resistance control input; and connecting said resistance controlling voltage output to each resistance control input to control an output resistance of each data output circuit to a substantially constant value.

23. An integrated circuit, comprising:

a plurality of I/O transceiver circuits;

a threshold voltage control circuit connected to each of said plurality of I/O transceiver circuits to control a receiving threshold voltage characteristic thereof; and an output resistance control circuit connected to each of said plurality of I/O transceiver circuits to control an output resistance thereof to a constant value.

* * * * *